United States Patent
Yukawa

(10) Patent No.: US 6,972,219 B2
(45) Date of Patent: Dec. 6, 2005

(54) THIN FILM TRANSISTOR SELF-ALIGNED TO A LIGHT-SHIELD LAYER

(75) Inventor: Teizo Yukawa, Miki (JP)

(73) Assignee: Koninklijke Philips Electronics N.V., Eindhoven (NL)

( * ) Notice: Subject to any disclaimer, the term of this patent is extended or adjusted under 35 U.S.C. 154(b) by 31 days.

(21) Appl. No.: 10/476,782

(22) PCT Filed: May 6, 2002

(86) PCT No.: PCT/IB02/01581

§ 371 (c)(1),
(2), (4) Date: Nov. 5, 2003

(87) PCT Pub. No.: WO02/091455

PCT Pub. Date: Nov. 14, 2002

(65) Prior Publication Data

US 2004/0126941 A1    Jul. 1, 2004

(51) Int. Cl.⁷ ........................ H01L 21/00; H01L 21/84

(52) U.S. Cl. ........................ 438/151; 438/160; 257/72

(58) Field of Search ................ 438/151, 160; 257/72

(56) References Cited

U.S. PATENT DOCUMENTS

| | | | | |
|---|---|---|---|---|
| 5,091,337 A | * | 2/1992 | Watanabe et al. | 438/159 |
| 5,371,025 A | * | 12/1994 | Sung | 438/160 |
| 5,747,828 A | * | 5/1998 | Hata et al. | 257/66 |
| 6,287,900 B1 | * | 9/2001 | Yamazaki et al. | 438/151 |
| 6,562,668 B2 | * | 5/2003 | Jang et al. | 438/158 |
| 6,686,229 B2 | * | 2/2004 | Deane et al. | 438/151 |
| 6,696,324 B2 | * | 2/2004 | Hong et al. | 438/149 |
| 6,759,281 B1 | * | 7/2004 | Kim et al. | 438/149 |
| 6,849,873 B2 | * | 2/2005 | Baek et al. | 257/72 |

FOREIGN PATENT DOCUMENTS

EP    1005025    5/2000    ............ G11B 7/00

* cited by examiner

Primary Examiner—Alexander Ghyka

(57) ABSTRACT

A method of manufacturing a thin film transistor with a reduced number of manufacturing steps is provided, in which the possibility of light entering the channel forming layer of the thin film transistor can be obviated. The thin film transistor comprising a gate electrode (16a), a drain electrode (12a), a source electrode (17a) and a channel (24) and a shield layer (21) on a transparent substrate (20). The channel (24) is formed in that a channel forming layer is photolithographically patterned with the shield layer (21) as mask. As shield layer (21), the gate electrode (16a) can be used, this giving a bottom gate thin film transistor. The transistor is very suitable for use in a liquid crystal display.

18 Claims, 4 Drawing Sheets

THIN FILM TRANSISTOR SELF-ALIGNED TO A LIGHT-SHIELD LAYER

BACKGROUND OF THE INVENTION

1. Field of the Invention

The present invention relates to a method of manufacturing a thin film transistor (TFT) and more particularly to an improved method of manufacturing thin film transistors suitable for use, for example, as elements for driving pixel electrodes of a liquid crystal display panel. The present invention further relates to a thin film transistor and a liquid crystal display panel manufactured using such manufacturing method.

2. Description of Related Art

Thin film transistors are widely used in electronic devices such as liquid crystal display devices. In particular, in a liquid crystal display panel of the active-matrix type, TFTs each having a source electrode, a drain electrode, a gate electrode and a channel region are used as elements for supplying pixel information to the pixel electrodes. Active-matrix liquid crystal display panels of the transmission type includes some in which shield films are provide for such TFTs (their channel regions, in particular), respectively, in order to prevent a light from the back light system disposed behind the display panel from entering them.

In a liquid crystal display panel of the above type, for example, when a given TFT is controlled to be in a fully off-state a leak current may be generated between the drain and the source due to optically excited carriers if a light from the back light system enters the channel region of this TFT. As a result, the potential of the corresponding pixel electrode changes, which leads to degradation in quality of the displayed picture. The above-described shield films maintain such entry of light into the channel regions of the TFTs as little as possible to prevent the degradation in quality of the displayed picture.

A liquid crystal display panel provided with such shield films is known, for example, from U.S. Pat. Nos. 4,723,838 and 5,691,782.

The liquid crystal display panel disclosed in U.S. Pat. No. 4,723,838 comprises, on the rear side of the display panel, shield films in correspondence with TFTs each of which is provided for a respective one of pixel electrodes arranged in a matrix. Each of these shield films serves to prevent a light from the back light system from entering a channel (a semiconductor layer) of the corresponding TFT. Conventionally, such shield films are formed in the following manner.

A film of a light-shielding material such as a metal is uniformly formed on a transparent substrate. The light-shielding material film is then subjected to a patterning process to remove those portions other than the regions which correspond to TFTs to be formed, with the result that a number of shield films are formed. Usually, an insulating layer made of SiO2, silicon nitride or the like and a transparent conductive layer made, for example, of ITO are then sequentially formed on the substrate on which the shield films have been formed in the above-described manner. Source electrodes, drain electrodes and pixel electrodes integral with the drain electrodes, respectively, are formed from the above transparent conductive layer by means of a patterning process. Then, the substrate provided with these elements is formed sequentially with a channel forming layer made of amorphous silicon (a-Si) or the like and a gate insulating layer made of silicon nitride or the like. The last-mentioned two layers are removed except for those island-shaped regions, respectively, by patterning a photo-resist layer formed on the gate insulating layer by its exposure to a light from a light source arranged on the top side (or on the side of the photo-resist layer) and the subsequent development and by carrying out an etching with the thus patterned photo-resist layer used as a mask. Each of these island-shaped regions is then provided on its top with a gate electrode, whereby a TFT is formed. Alternatively, use can be made of organic materials for the insulating and semiconductor layers, such as known from WO-A01/15223.

In the above-described conventional method of manufacturing TFTs, in addition to a photo mask for use in the process of forming the shield films another photomask for use in the process of forming the island-shaped regions is required. Usually, the above two masks are different ones and a positional error will occur in each positioning process of these masks, so that it is quite difficult to make the associated shield film and island-shaped region coincide in position and shape to each other as viewed in a direction perpendicular to the substrate. As a consequence, a light from the back light system may enter the island-shaped regions, i.e., the channel forming regions of the TFTs, whereby optically excited carriers are induced. These carriers cause leak currents between the drains and sources to increase, which may adversely affect the quality of the displayed picture. When the shield films are formed larger to prevent such entry of light, the numerical aperture of the panel may decrease, or a dark picture may result due to the excessive blocking of light from the back light system.

SUMMARY OF THE INVENTION

It is therefore an object of the present invention to provide a method of manufacturing a thin film transistor which can substantially eliminate, without degrading the display performance such as the numerical aperture, the possibility that a light enters a channel forming layer of the thin film transistor.

It is another object of the invention to provide a method of manufacturing a thin film transistor of the above type which requires a reduced number of photo masks and thus has simpler and less costly manufacturing steps as compared to the conventional method.

It is a further object of the invention to provide a thin film transistor which can substantially eliminate the possibility of light entering a channel forming layer thereof without degrading the display performance such as the numerical aperture.

It is a further object of the invention to provide a thin film transistor of the above type which can be manufactured at less cost.

It is a further object of the invention to provide a liquid crystal display panel which comprises thin film transistors of the above type and is less adversely affected by the back light system in terms of the picture quality.

To achieve the above objects, according to the present invention, there is provided a method of manufacturing a thin film transistor according to claim 1.

According to this method, when forming the island-shaped channel forming layer the exposure to light is performed from the side of the substrate (i.e., from the rear side) with the shield layer being used as a photomask, so that there is no need to provide another photomask which has been required in the conventional manufacturing method for the exposure from the front side, whereby the manufacturing steps are simplified. As a result of the shield layer being used as a photomask, the shield layer and the island-shaped channel forming layer agree in shape and position to each other substantially completely when viewed in a direction perpendicular to the substrate, that is to say both layers are self aligned. Thus, the occurrence of such phenomenon that optically excited carriers are induced by the light from the back light system entering the channel forming layer can be avoided in an efficient manner without sacrificing the numerical aperture and the like.

In a first embodiment of the method the source and drain electrodes are provided on the substrate, onto which the channel forming layer is applied. The gate electrode is then present on top. The channel is therewith in fact present between the shield layer and the gate electrode, that comprises a light-blocking conductive material, such as a metal or an organic conductive layer filled with black particles.

In a further embodiment the photolithographical patterning comprises the steps of:
providing a photoresist layer on the gate insulating layer;
patterning the photoresist layer based on exposing light from the side of said transparent substrate with said shield layer being used as a mask; and
selectively etching a lamination of said gate insulating layer and said channel forming layer with the patterned photoresist layer being used as a mask, therewith forming the island-shaped channel.

Although the photoresist layer may be patterned directly, for example by the addition of photochemical radical initiators, it is preferred that the patterning occurs indirectly, via an intermediate photoresist layer. According to this embodiment, the photoresist layer is present on top of the gate insulating layer. This has the advantage that the channel—and in particular the interface between the channel and the gate insulating layer—is protected from contaminations.

After the preferably indirect patterning of the channel forming layer the channel may be further protected. In a first variant a protective layer serving as a second gate insulating layer is provided. In a second variant side faces of the channel that contains amorphous silicon is locally oxidized.

In a second embodiment the method comprises the steps of:
providing the gate electrode as the shield layer on the substrate or an undercoat layer provided thereon, the gate-electrode comprising a light-blocking conductive material,
forming the gate insulating layer thereon,
forming the source electrode and the drain electrode on the gate insulating layer,
applying the channel forming layer on said gate insulating layer on which the source and drain electrodes have been formed.

According to this embodiment the gate electrode acts as the shield layer, and is present on the substrate. The resulting transistor is thus of the bottom gate type. Dependent on the application of the transistor and of the material of the channel, it may be that no further shield layer on top of the source and drain electrodes is necessary anymore. If it is necessary, it can be provided as a unpatterned layer or as a patterned layer. The layer can be patterned according to the same pattern as the layer comprising the gate electrode. This has the advantage that the number of masks can be reduced.

Also in this second embodiment, it is preferred that the channel forming layer is patterned indirectly. Therefore, an additional insulating layer is applied on top of the channel forming layer before the photolithographical patterning.

It is advantageous to provide a protective layer on top of the channel. Such a protective layer preferably delimits a pixel region, if the transistor is to be used in a liquid crystal display.

It is observed that many transistors can be provided in a single substrate in a single process as outlined in the claims. Further on, the source and the drain electrode are generally provided as patterns in a single layer, that will further contain a plurality of interconnect lines. The gate electrode is provided as a pattern in a layer as well and further contains a plurality of interconnect lines. The source or the drain electrode is connected to a pixel electrode, if used in a liquid crystalline display.

According to the present invention, there is further provided a liquid crystal display comprising a thin film transistor obtainable with the method according to any of the claims 1–8, further comprising a pixel electrode connected to the source or drain electrode and a layer of liquid crystalline material. This display can be made cost-effectively. It has a good picture quality and good life time by virtue of the fact that no leakage current will be induced in the channel under the influence of the back light system.

These and other aspects of the invention will be further discussed and elucidated with reference to the drawings, in which:

DESCRIPTION OF THE PREFERRED
EMBODIMENT(S)

Embodiments of the invention will now be described with reference to the accompanying drawings.

Figure 1:
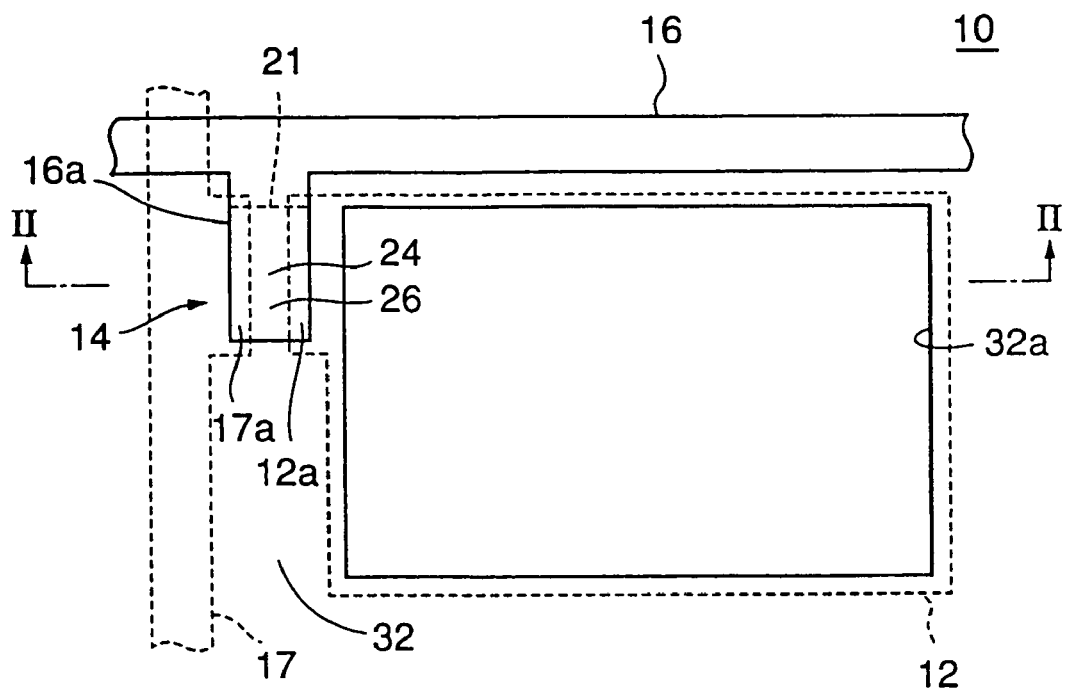
FIG. 1 is a diagrammatic plan view of a part of a liquid crystal display panel having thin film transistors manufactured in accordance with a first embodiment of the present invention.

FIG. 1 is a plan view of a liquid crystal display panel manufactured by applying a first embodiment of the method of manufacturing a thin film transistor according to the invention to TFTs of the top-gate type, wherein only a part of the panel corresponding to one pixel is diagrammatically shown. FIG. 2 is an illustration showing various steps of the manufacturing method according to the first embodiment in cross-sectional views taken along line II—II of FIG. 1.

A liquid crystal display panel 10 to which the first embodiment has been applied comprises a number of pixel electrodes 12 which are formed on a transparent substrate with an insulating layer interposed therebetween and are arranged in a matrix fashion, the transparent substrate being disposed on the rear side of the panel. Each pixel electrode 12 is provided, in an adjacent relation thereto, a thin film transistor (TFT) 14 for driving this pixel electrode. The TFT 14 is connected to a gate line 16 extending in the row direction of the liquid crystal display panel 10 and to a source line 17 extending in the column direction of the panel, and is adapted to be driven by signals applied to both lines in accordance with pixel information. Although not shown in FIG. 1, the liquid crystal display panel 10 further comprises a transparent protective substrate and other elements which are disposed in an opposed relation to the above structure including the transparent substrate and those elements shown in FIG. 1 with a liquid crystal material sandwiched therebetween (that is to say, the transparent protective substrate and other elements are disposed on the front side of the panel). The panel 10 is thus arranged to display an image by applying voltages present between a transparent common electrode provided on the transparent protective substrate and the respective pixel electrodes to the liquid crystal material and illuminating the panel from the rear side by means of a back light system.

Hereinafter, the method of manufacturing the above thin film transistors 14 will be described in more detail with reference to FIG. 2. In the following description, the upper side of FIG. 2 is referred to as the front side and the lower side as the rear side as the case may be.

First, a substrate 20 made of a transparent material such as glass and quartz is prepared. Then, a film composed of a light-blocking material such as chromium is formed on the entire surface of the transparent substrate 20 with a uniform thickness, for example, by sputtering. This light-blocking material film is patterned by a known lithography utilizing a first photomask to form shield films 21 each at a position which corresponds to a respective one of the thin film transistors 14 to be fabricated (see FIG. 2 at (a)). In this manner, a number of shield films 21 each having a substantially rectangular top view are formed on the substrate 20 in a matrix fashion.

Subsequently, an insulating layer 22 composed, for example, of $SiO_2$ is formed on the entire surface of the substrate 20, on which the shield layers 21 have been formed, with a uniform thickness by means of a plasma CVD (Chemical Vapour Deposition) method. A layer of a transparent conductive material such as ITO is then formed on the thus formed insulating layer 22 with a uniform thickness, for example, by sputtering. This transparent conductive material layer is patterned by a known photolithography utilizing a second photomask, so that pixel electrodes 12, drain electrodes 12a each as a part of the corresponding pixel electrode 12, source lines 17 and source electrodes 17a integral with the corresponding source line 17 are formed (see FIG. 2 at (b)). Then, the structure as obtained in the step shown in FIG. 2 at (b) is doped in its upper surface with phosphorous for the subsequent steps.

Subsequently, a channel forming layer 24 composed of a semiconductor material such as amorphous silicon (a-Si) and a gate insulating layer 26 composed of an insulating material such as silicon nitride ($SiN_x$) are sequentially formed on the entire surface of the above-mentioned structure, for example, in a plasma CVD method. In this case, the doped phosphorous mentioned above diffuses into the portions of the channel forming layer 24 interfacing with the pixel electrodes 12, drain electrodes 12a, source lines 17 and source electrodes 17a, whereby n+a-Si films, for example, are formed therein, which allow good ohmic contacts to be achieved between the channel forming layer 24 and the drain and source electrodes 12a and 17a. Then, a photoresist layer 28 is formed on the gate insulating layer 26. This photoresist layer 28 is exposed to a light from the side of the substrate 20 with the shield layers 21 being used as a mask. The photoresist layer 28 thus exposed to the light from the rear side is then developed, with the result that only those regions 28' which correspond to the shield layers 21, respectively, are left on the gate insulating layer 26. Subsequently, the gate insulating layer 26 and the channel forming layer 24 are selectively etched by means of a known etching method with the photoresist layers 28' being used as a mask, so that island-shaped regions 30 each including the channel forming layer 24 and the gate insulating layer 26 are formed (see FIG. 2 at (d)). The photoresist layer 28' left on each island-shaped region 30 is then removed in a known method.

Subsequently, an insulating layer 32 composed of an insulating material such as silicon nitride is formed on the entire surface of the above structure. This insulating layer 32 is then patterned in a known photolithography utilizing a third photomask, so that windows 32a each for exposing a respective one of the pixel electrodes 12 are formed in the insulating layer 32 (see FIG. 2 at (e)).

Subsequently, a metal layer composed of aluminium or the like is formed on the entire surface of the structure with a certain thickness, for example, by sputtering. This metal layer is then patterned by a known photolithography utilizing a fourth photomask, so that gate electrodes 16a each disposed above a respective one of the island-shaped regions 30 and gate lines 16 each connected in common to a row of gate electrodes 16a are formed on the insulating layer 32 (see FIG. 2 at (f)). In this manner, TFTs 14 each comprising the drain and source electrodes 12a and 17a, channel forming layer 24, gate insulating layers 26 and 31, and gate electrode 16a are obtained.

The structure as obtained in the step shown in FIG. 2 at (f) is then formed on its entire surface, for example, with a protective film and/or an orientation film, but detailed description of such steps will be omitted since they are well known.

In the manufacturing method according to the above-described first embodiment, when forming the island-shaped channel forming layers 30 each including the channel forming layer 24, the exposure to light is performed from the rear side with the shield layers 21 being used as a photomask, so that there is no need to provide another photomask which has been required in the conventional manufacturing method for the exposure from the front side, whereby the manufacturing steps are simplified. As a result of the shield layers 21 being used as a photomask, each shield layer 21 and the corresponding island-shaped channel forming layer 24 agree in shape and position to each other substantially completely when viewed in a direction perpendicular to the substrate 20, that is to say both layers are self aligned. Thus, there is practically no possibility that optically excited carriers may be induced by the light from the back light system entering the channel forming layers 24. Therefore, with the liquid crystal display panel 10 manufactured in this manufacturing method, a good picture quality which is less susceptible to the back light system can be obtained. Furthermore, the shield layers 21 will not be formed unduly large with respect to the channel forming layers 24 by virtue of the above-mentioned self-alignment, so that the entry of light from the back light system to the channel forming layers 24 can be prevented in an efficient manner and that the aforementioned reduction of numerical aperture can be avoided.

A modification of the above-described first embodiment will now be described with reference to FIG. 3.

This modification is to prevent side faces of the channel forming layer 24 from contacting a pattern of the gate electrode 16a by making the side faces of the channel forming layer insulative instead of covering the island-shaped region 30 in its entirety with the insulating layer 32, and has manufacturing steps which are different from those shown in FIG. 2 in the following respects.

Figure 3:
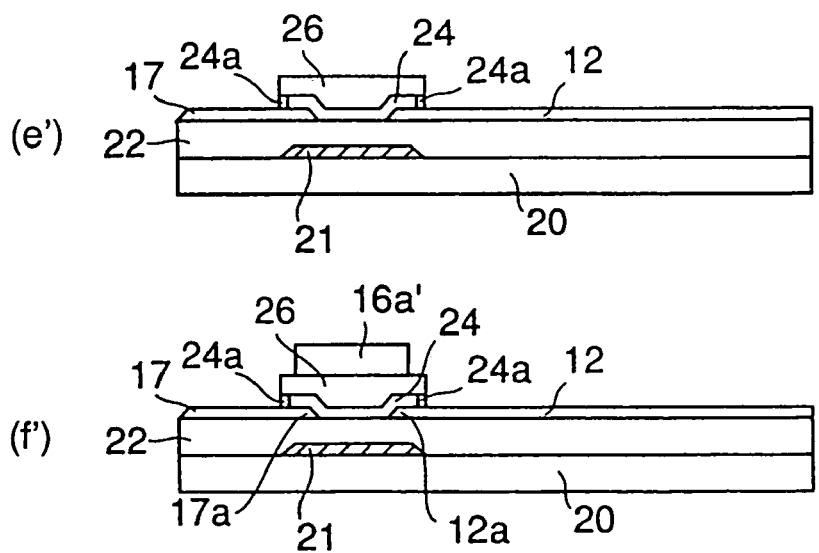
FIG. 3 is an illustration which explains some manufacturing steps in a variant of the first embodiment of the invention.
Figure 2A:
FIG. 2 is an illustration showing the part of FIG. 1 in cross-section taken along the line II—II of FIG. 1 in various manufacturing steps of the first embodiment of the invention.
Figure 2B:
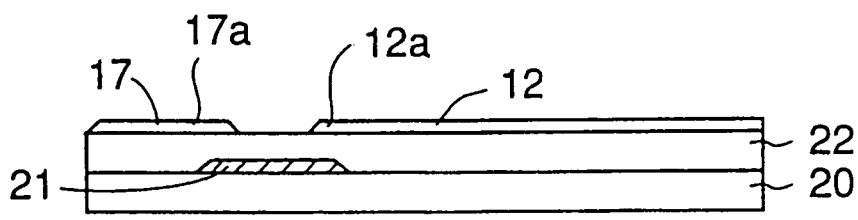
Figure 2C:
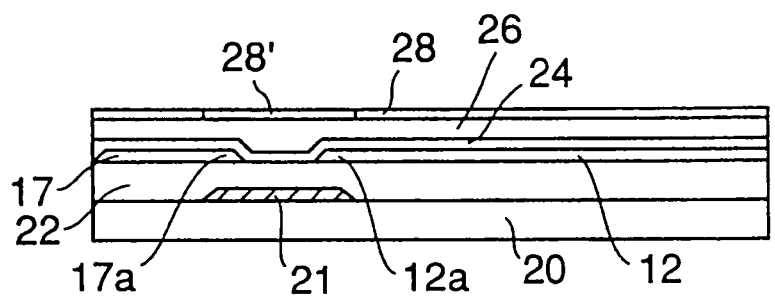
Figure 2D:
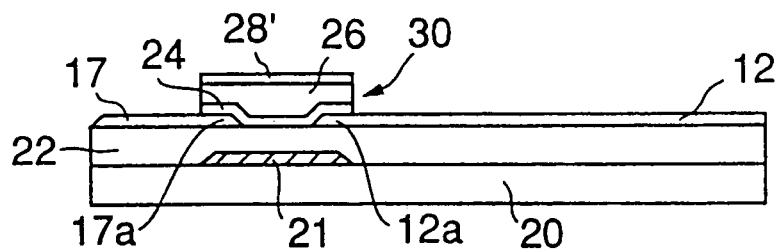
Figure 2E:
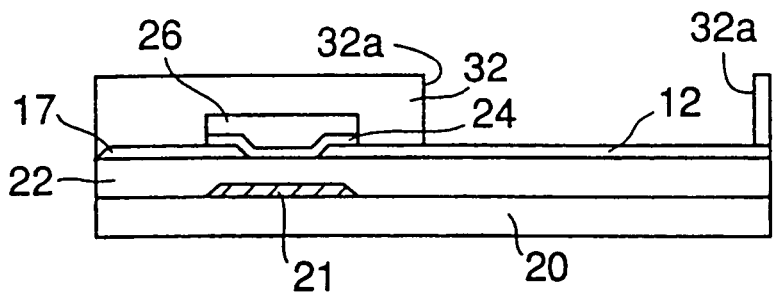
Figure 2F:
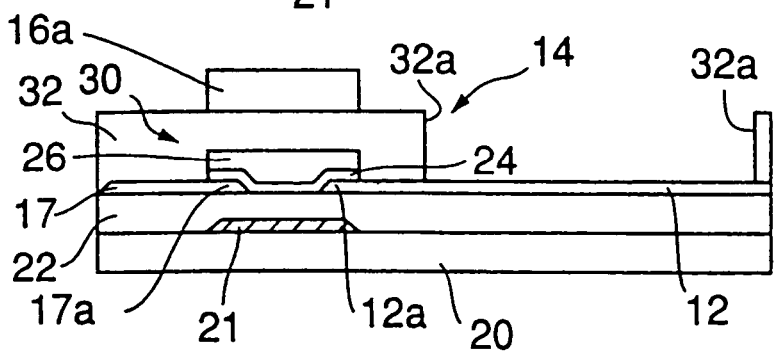
Figure 4A:
FIG. 4 is an illustration which explains some steps in the method of manufacturing a thin film transistor according to the second embodiment of the invention, in which the transistor is shown in cross-sectional view in each step.
Figure 4B:
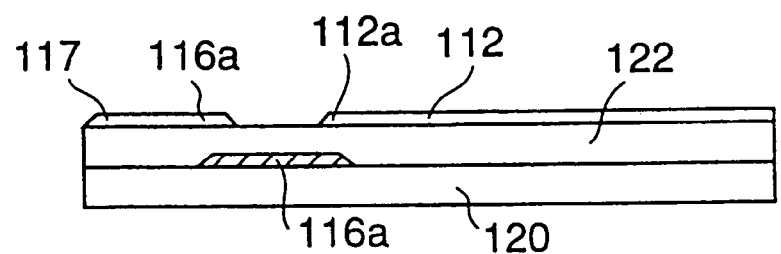
Figure 4C:
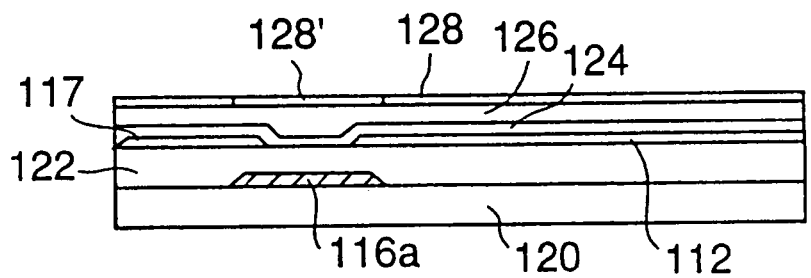
Figure 4D:
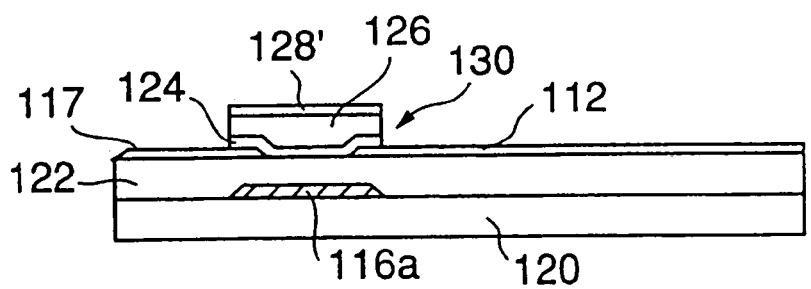
Figure 4E:
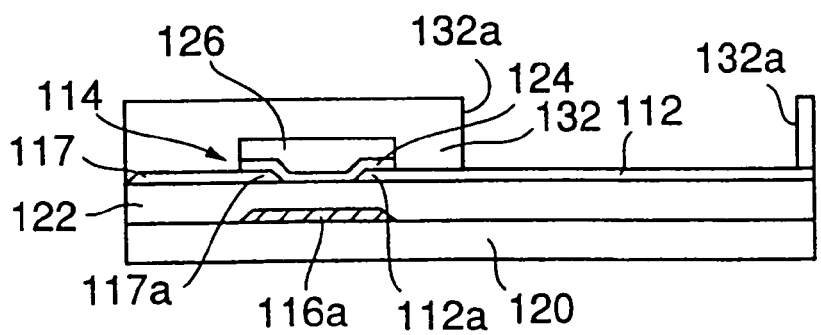

After the step shown in FIG. 2 at (d), an insulating film 24a composed of $SiO_2$ is formed by the oxidization of side faces of the channel forming layer 24 by carrying out a plasma oxidation treatment in a known manner as shown in FIG. 3 at (e'). Then, the photoresist layer 28' is removed. Alternatively, the photoresist layer 28' may be removed prior to the above plasma oxidation treatment.

Subsequently, a metal layer composed of aluminium or the like is formed on the entire surface of the structure with a certain thickness, for example, by sputtering. This metal layer is then patterned by a known photolithography utilizing the fourth photomask, so that gate electrodes 16a' and gate patterns 16 are formed on the gate insulating layer 26.

According to this modification, there is no need to provide the insulating layer 32 in the first embodiment and only the single gate layer 26 is present between the channel forming layer 24 and the gate electrode 16a', which renders the manufacturing steps simpler and less expensive.

Next, a second embodiment of the present invention, in which the method of manufacturing a thin film transistor according to the invention is applied to a TFT of the bottom-gate type, will be described.

FIG. 4 is an illustration showing various steps in this second embodiment in a manner similar to FIG. 2. First, a layer composed of a light-blocking conductive material, e.g., a metal such as aluminium, is formed on the entire surface of a transparent substrate 120 made, for example, of glass or quartz with a uniform thickness by sputtering or the like. This metal layer is patterned by a known lithography utilizing a first photomask to form gate electrodes 116a and gate lines 116 (FIG. 5) each of which is integral with the gate electrodes 116a (see FIG. 4 at (a)).

Subsequently, a gate insulating layer 122 composed, for example, of $SiO_2$ is formed on the entire surface of the substrate 120, on which the gates electrodes 116a and the gate lines 116 have been formed, with a uniform thickness by means of a plasma CVD method or the like. A layer of a transparent conductive material such as ITO is then formed on the thus formed gate insulating layer 122 with a uniform thickness, for example, by sputtering. This transparent conductive material layer is patterned by a known photolithography utilizing a second photomask, so that pixel electrodes 112, drain electrodes 112a each as a part of the corresponding pixel electrode 112, source lines 117 and source electrodes 117a integral with the corresponding source line 117 are formed (see FIG. 4 at (b)). Then, the structure as obtained in the step shown in FIG. 4 at (b) is doped in its upper surface with phosphorous for the subsequent steps.

Subsequently, a channel forming layer 124 composed of a semiconductor material such as amorphous silicon (a-Si) and an insulating layer 126 composed of an insulating material such as silicon nitride ($SiN_x$) are sequentially formed on the entire surface of the above structure, for example, in a plasma CVD method. In this case, the doped phosphorous mentioned above diffuses into the portions of the channel forming layer 124 interfacing with the pixel electrodes 112, drain electrodes 112a, source lines 117 and source electrodes 117a, whereby n+a-Si films, for example, are formed therein, which allow good ohmic contacts to be achieved between the channel forming layer 124 and the drain and source electrodes 112a and 117a. Then, a photoresist layer 128 is formed on the insulating layer 126. This photoresist layer 128 is exposed to a light from the side of the substrate 120 (i.e., from the rear side) with the gate electrodes 116a and gate lines 116 being used as one mask. Further, the photoresist layer 128 is exposed to a light from the upper side in the drawing (i.e., from the front side of the panel) using a third photomask (the other photomask) of a simple configuration which has predetermined light-blocking stripes extending in a direction perpendicular to the length of the gate electrodes 116a (that is to say, in the horizontal direction in FIG. 4).

Figure 5:
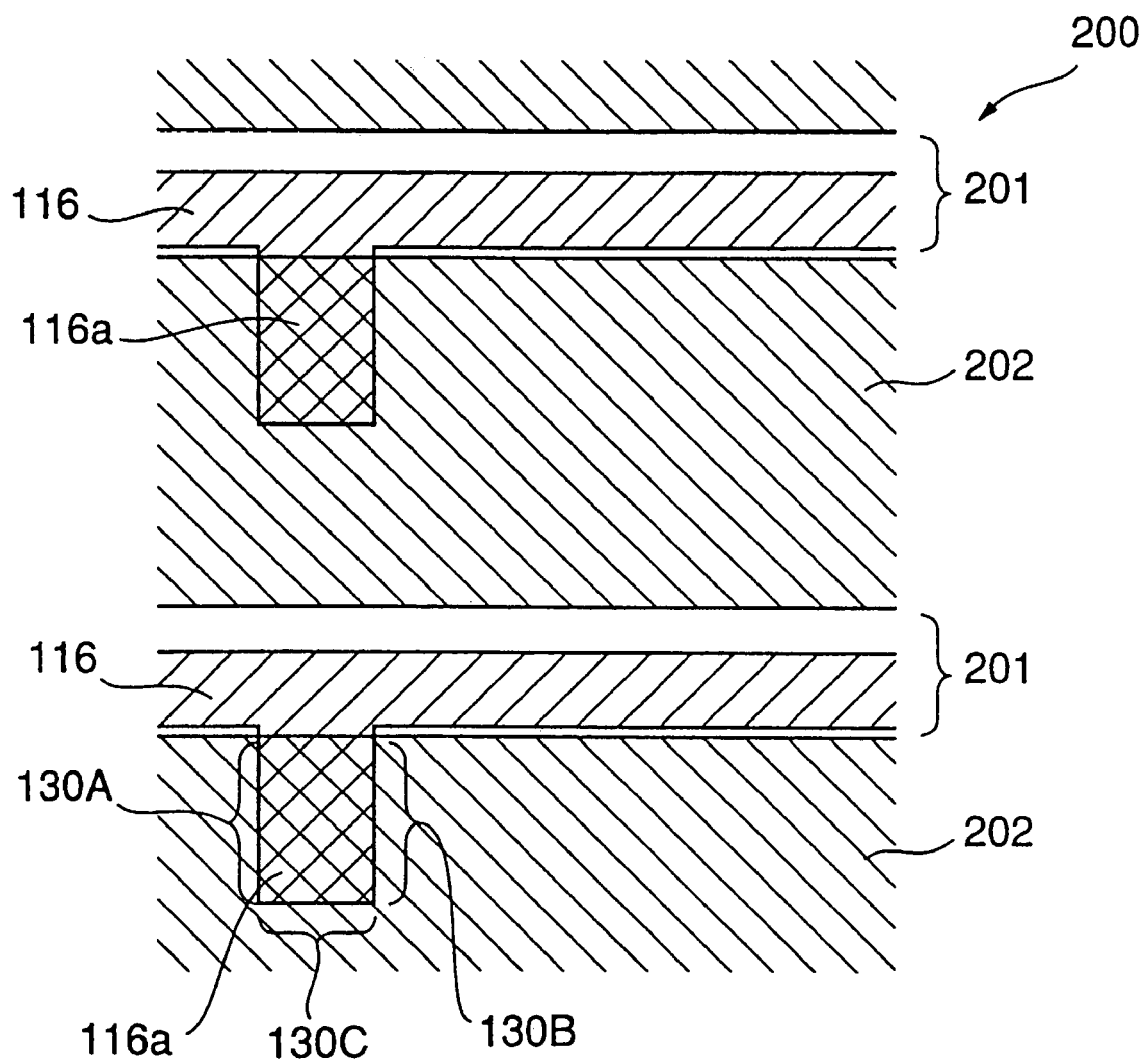
FIG. 5 is a diagrammatic plan view of the masks as used in the method of manufacturing a thin film transistor according to the second embodiment of the invention.

FIG. 5 schematically illustrates the above-mentioned one and the other masks in a plan view, and shows that the one mask with the gate electrodes 116a and gate lines 116 and the other mask 200 have overlapping areas (cross-hatched areas) which are those regions where the channel forming layers should be formed. More specifically, the other mask 200 should have such a pattern that at least those regions which correspond to the gate electrodes 116a, i.e., the channel forming layers, are not exposed to the light from the top side. In the present example, the mask 200 has a pattern which causes all the regions of the gate lines 116 to be exposed to the light from the top side. This pattern can be formed by providing light-transmissive linear stripes 201 which extend along the gate lines 116 to encompass them and light-blocking linear stripes 202 arranged alternately with the stripes 201, and is thus very simple. As will be appreciated from FIG. 5, the mask 200 should only be positioned in one direction (i.e., in the vertical direction in FIG. 5) and thus contributes to the simplification of the manufacturing steps.

The photoresist layer 128 thus exposed to light is then developed, with the result that only those regions 128' which correspond to the gate electrodes 116a, respectively, are left on the insulating layer 126. Subsequently, the insulating layer 126 and the channel forming layer 124 are selectively etched by means of a known etching method with the photoresist layers 128' being used as a mask, so that island-shaped regions 130 each including the channel forming layer 124 and the insulating layer 126 are formed (see FIG. 4 at (d)). The photoresist layer 128' left on each island-shaped region 130 is then removed in a known method.

Subsequently, a protective layer 132 composed of an insulating material such as silicon nitride is formed on the entire surface of the above structure. This protective layer 132 is then patterned in a known photolithography utilizing a fourth photomask, so that windows 132a each for exposing a respective one of the pixel electrodes 112 are formed in the protective layer 132 (see FIG. 4 at (e)). Subsequently, terminal portions of the gate lines are exposed in a known method. In this manner, TFTs 114 each comprising the drain and source electrodes 112a and 117a, channel forming layer 124, gate insulating layer 122, and gate electrode 116a are obtained.

The structure as obtained in the step shown in FIG. 4 at (e) is then formed on its entire surface, for example, with an orientation film, but detailed description of such steps will be omitted since they are well known.

In the manufacturing method according to the above-described second embodiment, when forming the island-shaped channel forming layers 130 each including the channel forming layer 124, the exposure to light is performed from the rear side with the gate electrodes 116a being used as a photomask, so that when viewed in a direction perpendicular to the substrate 120 each gate electrode 116a and the corresponding channel forming layer 124 agree in shape and position to each other substantially completely, that is to say both layers are self aligned, at least with respect to a pair of opposite sides thereof (the sides 130A and 130B shown in FIG. 5; in the present example, the side 130C is also self-aligned). Thus, the possibility that optically excited carriers may be induced by the light from the back light system entering the channel forming layers 124 is quite low. Therefore, with the liquid crystal display panel manufactured in this manufacturing method, a good picture quality which is less susceptible to the back light system can be obtained. Furthermore, by virtue of the above-mentioned self-alignment, the entry of light from the back light system to the channel forming layers can be prevented in an efficient manner and at the same time the aforementioned reduction of numerical aperture can be avoided.

In the manufacturing steps of the second embodiment shown in FIG. 4 from (c) to (e), the formation of the insulating layer 126 may be omitted and instead only the protective layer 132 may be provided.

In the above-described second embodiment, the island-shaped region 130 is formed utilizing the one mask (the gate electrodes and so on) on the rear side and the other mask on the front side. Alternatively, the channel forming layer is first patterned into shapes corresponding to the gate electrodes and so on (in plan view) in the step of FIG. 4 (c) solely with the one mask, and then the channel forming layer is finally patterned into the island shapes simultaneously with the formation of the windows 132a in the protective layer 132 in the step of FIG. 4 (e). In this case, upon the patterning of the channel forming layer into the island shapes the side faces thereof will be exposed, so that it will be desirable to subject these exposed side faces to an insulating treatment such as an oxidation treatment and a nitriding treatment in a manner described above with reference to FIG. 3. As a matter of course, the patterning into island shapes described above is not essential since the channel forming layers can achieve their fundamental functions even if they are not formed into island shapes. Nevertheless, it will be desirable to form the channel forming layer into island shapes when the performance of the TFT in terms of the resistance to leakage currents or the like is taken into consideration.

Although the shield layers and the gate electrodes are formed directly on the substrate in the above-described respective embodiments, it goes without saying that these elements may alternatively be formed on an under-coat layer provided on the substrate. Likewise, the invention does not exclude the provision of additional elements in other layers and parts. Also, any modification is possible to the embodiments of the invention as required without departing from the scope of the invention described in the claims.

What is claimed is:

1. A method of manufacturing a thin film transistor comprising a transparent substrate; a source and a drain electrode that are mutually separated by a channel; and a gate electrode that is isolated from the channel through a gate insulating layer, comprising:

forming the gate electrode on the transparent substrate, the gate electrode comprising a light-shielding, conductive material;

forming the gate insulating layer on the gate electrode;

forming the source and drain electrodes on the gate insulating layer;

forming a channel-forming layer on the gate insulating layer and on the source and drain electrodes; and patterning the channel-forming layer to form the channel by using the gate electrode as a photolithography mask.

2. The method of claim 1, wherein patterning the channel-forming layer to form the channel comprises:

providing a second insulating layer on the channel layer;

providing a photoresist layer on the second insulating layer;

patterning the photoresist layer based on exposing light from a first side of said transparent substrate with said gate electrode being used as a mask; and selectively etching the second insulating layer and said channel forming layer with the patterned photoresist layer being used as a mask.

3. A method of manufacturing a thin film transistor comprising a substrate; a source and a drain electrode that are mutually separated by a channel; and a gate electrode that is isolated from the channel through a gate insulating layer, the channel being formed comprising the steps of applying a channel forming layer and photolithopraphical patterning of the channel forming layer with a mask, characterized in that the substrate is transparent and is provided with the mask for patterning the channel forming layer, the mask being a shield layer to prevent light from entering the channel, wherein the gate electrode is formed on the island-shaped channel with a gate insulating layer being interposed therebetween, comprising the steps of:

oxidizing side faces of said channel comprising amorphous silicon, and forming said gate electrode on said channel having the oxidized side faces with the gate insulating layer being interposed therebetween.

4. A method of manufacturing a thin film transistor comprising a substrate; a source and a drain electrode that are mutually separated by a channel; and a gate electrode that is isolated from the channel through a gate insulating layer, the channel being formed comprising the steps of applying a channel forming layer and photolithographical patterning of the channel forming layer with a mask, characterized in that the substrate is transparent and is provided with the mask for patterning the channel forming layer, the mask being a shield layer to prevent light from entering the channel, further comprising the steps of:

providing the gate electrode as the shield layer on the substrate or an undercoat layer provided thereon, the gate-electrode comprising a light-blocking conductive material, forming the gate insulating layer thereon, forming the source electrode and the drain electrode on the gate insulating layer, and applying the channel forming layer on said gate insulating layer on which the source and drain electrodes have been formed.

5. The method of claim 4, further comprising:

applying an insulating layer on the channel forming layer;

forming a photoresist layer on the insulating layer;

patterning the photoresist layer by exposing it to light from the side of the transparent substrate with said gate electrode being used as the mask and by selectively etching a lamination of the insulating layer and the channel forming layer with the patterned photoresist being used as a mask.

6. The method of claim 4, wherein after patterning the channel forming layer into the channel a protective layer is formed that covers at least a side face of the channel, the protective layer delimiting a pixel region.

7. A liquid crystal display comprising a thin film transistor obtainable with the method according to claim 1, further comprising a pixel electrode connected to the source or drain electrode and a layer of liquid crystalline material.

8. A liquid crystal display according to claim 7, wherein the substrate is present between the thin film transistor and a backlight, the shield layer shielding the channel of the transistor from the backlight.

9. A liquid crystal display comprising a thin film transistor fabricated with the method of claim 3, further comprising a pixel electrode connected to the source or drain electrode and a layer of liquid crystalline material.

10. The method of claim 3, further comprising doping phosphorous into upper surfaces of the source and drain electrodes prior to applying the channel-forming layer.

11. A liquid crystal display comprising a thin film transistor fabricated with the method of claim 4, further comprising a pixel electrode connected to the source or drain electrode and a layer of liquid crystalline material.

12. The method of claim 4, further comprising doping phosphorous into upper surfaces of the source and drain electrodes prior to applying the channel-forming layer.

13. The method of claim 4, wherein photolithographical patterning of the channel forming layer further comprises exposing light from a top side of said transparent substrate using a photolithography mask.

14. The method of claim 5, wherein after patterning the channel forming layer into the channel a protective layer is formed that covers at least a side face of the channel, the protective layer delimiting a pixel region.

15. The method of claim 2, further comprising patterning the photoresist layer based on exposing light from a second side of said transparent substrate using a second photolithography mask prior to the step of selectively etching the second insulating layer and said channel forming layer with the patterned photoresist layer being used as a mask.

16. The method of claim 2, further comprising forming a protective layer on the second insulating layer.

17. The method of claim 1, where the source and gate electrodes are indium tin oxide (ITO).

18. The method of claim 1, further comprising doping phosphorous into upper surfaces of the source and drain electrodes prior to forming the channel-forming layer thereon.

* * * * *